(12) United States Patent
Kishimoto et al.

(10) Patent No.: US 11,437,560 B2
(45) Date of Patent: Sep. 6, 2022

(54) MULTILAYER PIEZOELECTRIC ELEMENT, PIEZOELECTRIC VIBRATION APPARATUS, AND ELECTRONIC DEVICE

(71) Applicant: TAIYO YUDEN CO., LTD., Tokyo (JP)

(72) Inventors: Sumiaki Kishimoto, Takasaki (JP); Hiroyuki Shimizu, Takasaki (JP); Tomohiro Harada, Takasaki (JP); Yukihiro Konishi, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1103 days.

(21) Appl. No.: 16/011,286

(22) Filed: Jun. 18, 2018

(65) Prior Publication Data
US 2018/0375010 A1 Dec. 27, 2018

(30) Foreign Application Priority Data

Jun. 22, 2017 (JP) .............................. JP2017-122193
Mar. 13, 2018 (JP) .............................. JP2018-045559

(51) Int. Cl.
*H01L 41/047* (2006.01)
*B06B 1/06* (2006.01)
(Continued)

(52) U.S. Cl.
CPC ........ *H01L 41/0471* (2013.01); *B06B 1/0603* (2013.01); *B06B 1/0611* (2013.01);
(Continued)

(58) Field of Classification Search
CPC ............. H01L 41/0471; H01L 41/0472; H01L 41/083; B06B 1/0664
See application file for complete search history.

(56) References Cited

U.S. PATENT DOCUMENTS

2009/0243442 A1* 10/2009 Osawa ................ H01L 41/0472
29/25.35
2013/0342082 A1* 12/2013 Itoh ........................ H01L 41/04
310/366
(Continued)

FOREIGN PATENT DOCUMENTS

JP     2001244138 A     9/2001
JP     2016100760 A     5/2016
(Continued)

OTHER PUBLICATIONS

A Notification of Reason for Refusal issued by Korean Intellectual Property Office, dated Aug. 27, 2019, for Korean counterpart application No. 1020180071401. (5 pages).

*Primary Examiner* — Bryan P Gordon
(74) *Attorney, Agent, or Firm* — Law Office of Katsuhiro Arai

(57) ABSTRACT

In an embodiment, a multilayer piezoelectric element includes a multilayer piezoelectric body and multiple internal electrodes. The multilayer piezoelectric body has a pair of principal faces in a first-axis direction, a pair of end faces in a second-axis direction crossing at right angles with the first-axis direction and defining the longitudinal direction, and a pair of side faces in a third-axis direction crossing at right angles with the first-axis direction and second-axis direction. The multiple internal electrodes are placed inside the multilayer piezoelectric body and stacked in the first-axis direction. Among the multiple internal electrodes, a center internal electrode placed at the center part of the multilayer piezoelectric body is such that its first cross-sectional shape, as viewed from the third-axis direction, has undulations greater than the undulations of the second cross-sectional shape of the center internal electrode as viewed from the second-axis direction.

12 Claims, 9 Drawing Sheets

(51) Int. Cl.
  *H01L 41/083* (2006.01)
  *G06F 3/01* (2006.01)
  *H01L 41/297* (2013.01)
  *H01L 41/293* (2013.01)
  *H01L 41/257* (2013.01)
  *H01L 41/09* (2006.01)
  *H01L 41/273* (2013.01)

(52) U.S. Cl.
  CPC .......... *B06B 1/0644* (2013.01); *B06B 1/0662* (2013.01); *G06F 3/016* (2013.01); *H01L 41/0472* (2013.01); *H01L 41/083* (2013.01); *H01L 41/0973* (2013.01); *H01L 41/0986* (2013.01); *H01L 41/257* (2013.01); *H01L 41/293* (2013.01); *H01L 41/297* (2013.01); *H01L 41/273* (2013.01)

(56) References Cited

U.S. PATENT DOCUMENTS

| | | | |
|---|---|---|---|
| 2014/0116766 A1* | 5/2014 | Jeon | H05K 3/3442 361/321.2 |
| 2014/0167568 A1* | 6/2014 | Ozawa | G02B 7/08 310/364 |
| 2015/0028723 A1* | 1/2015 | Ikeda | H01L 41/0471 310/323.16 |
| 2015/0171309 A1* | 6/2015 | Kubota | H02N 2/106 347/68 |
| 2017/0311086 A1 | 10/2017 | Ishii et al. | |
| 2017/0313625 A1* | 11/2017 | Sumi | C04B 35/453 |

FOREIGN PATENT DOCUMENTS

| | | |
|---|---|---|
| KR | 1020100012142 A | 2/2010 |
| KR | 1020140080458 A | 6/2014 |
| KR | 101528797 B1 | 6/2015 |
| WO | 2016052582 A1 | 4/2016 |

* cited by examiner

MULTILAYER PIEZOELECTRIC ELEMENT, PIEZOELECTRIC VIBRATION APPARATUS, AND ELECTRONIC DEVICE

BACKGROUND

Field of the Invention

The present invention relates to a multilayer piezoelectric element comprising alternately stacked piezoelectric bodies and electrodes, a piezoelectric vibration apparatus, and an electronic device.

Description of the Related Art

A multilayer piezoelectric element comprising many alternately stacked piezoelectric bodies and internal electrodes, and also having end electrodes (external electrodes) connected with these internal electrodes, is known (refer to Patent Literature 1). When voltage is applied to the multiple piezoelectric bodies through the external electrodes and internal electrodes, the multilayer piezoelectric element expands and contracts due to the piezoelectric inverse effect. Multilayer piezoelectric elements of this type can achieve a large displacement despite their small size, and thus are widely used for actuator components that must generate a large force and respond quickly.

Known vibration modes that can be assumed by a multilayer piezoelectric element include a vibration mode in which the piezoelectric constant of expansion/contraction in the thickness direction (stacking direction) is d33, and a vibration mode in which the piezoelectric constant of expansion/contraction in the direction along the internal electrode surface is d31. A multilayer piezoelectric element allows its vibration modes to be controlled by controlling its shape, etc. For example, by shaping a multilayer piezoelectric element so that the direction along the internal electrode surface defines the longitudinal direction, the d31 vibration mode can be made dominant.

BACKGROUND ART LITERATURES

[Patent Literature 1] Japanese Patent Laid-open No. 2016-100760
[Patent Literature 2] International Patent Laid-open No. 2016/052582

SUMMARY

A multilayer piezoelectric element has multiple electrodes that do not function as piezoelectric bodies, as described above. Accordingly, improving its displacement performance requires an optimal structural design suitable for the vibration mode.

In light of the above situation, an object of the present invention is to provide a multilayer piezoelectric element, a piezoelectric vibration apparatus, and an electronic device, all offering high displacement performance.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the multilayer piezoelectric element pertaining to a mode of the present invention comprises a multilayer piezoelectric body and multiple internal electrodes.

The multilayer piezoelectric body has a pair of principal faces that are facing each other in a first-axis direction, a pair of end faces that are facing each other in a second-axis direction crossing at right angles with the first-axis direction and defining the longitudinal direction, and a pair of side faces that are facing each other in a third-axis direction crossing at right angles with the first-axis direction and second-axis direction.

The multiple internal electrodes are placed inside the multilayer piezoelectric body and stacked in the first-axis direction.

Among the multiple internal electrodes, a center internal electrode placed at the center part of the multilayer piezoelectric body is such that its first cross-sectional shape, as viewed from the third-axis direction, has undulations greater than the undulations of the second cross-sectional shape of the center internal electrode as viewed from the second-axis direction.

According to the aforementioned constitution, the internal electrode placed at the center has greater undulations along the longitudinal direction, and this allows for improvement of displacement performance along the longitudinal direction.

To be specific, a maximum dimension of divergence in the first-axis direction between a first running line that runs along the center of the first cross-sectional shape in the first-axis direction and has a length of 100 μm in the second-axis direction, and a first reference line that connects the end points of the first running line, may be greater than a maximum dimension of divergence in the first-axis direction between a second running line that runs along the center of the second cross-sectional shape in the first-axis direction and has a length of 100 μm in the third-axis direction, and a second reference line that connects the end points of the second running line.

This way, a constitution where the internal electrode placed at the center has micro-undulations along the longitudinal direction, can be achieved.

For example, the maximum dimension of divergence between the first running line and the first reference line may be 2 μm or greater.

Furthermore, the first cross-sectional shape may have greater undulations than the undulations of a third cross-sectional shape, as viewed from the third-axis direction, of, among the multiple internal electrodes, a marginal (peripheral) internal electrode placed at the position closest to one of the pair of principal faces of the multilayer piezoelectric body.

This way, a constitution where the internal electrode placed at the center has greater undulations than the undulations of the internal electrode placed at the periphery, can be achieved.

The piezoelectric vibration apparatus pertaining to a mode of the present invention comprises the aforementioned multilayer piezoelectric element, a vibration plate, and an adhesive layer.

The vibration plate faces the multilayer piezoelectric element in the first-axis direction.

The adhesive layer is placed between the multilayer piezoelectric element and the vibration plate.

The electronic device pertaining to a mode of the present invention comprises the aforementioned multilayer piezoelectric element, a panel, and a housing.

The panel has the multilayer piezoelectric element adhered to it in such a way that the two are facing each other in the first-axis direction.

The housing retains the panel.

As described above, according to the present invention, a multilayer piezoelectric element, a piezoelectric vibration apparatus, and an electronic device, all offering high displacement performance, can be provided.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

Figure 1:
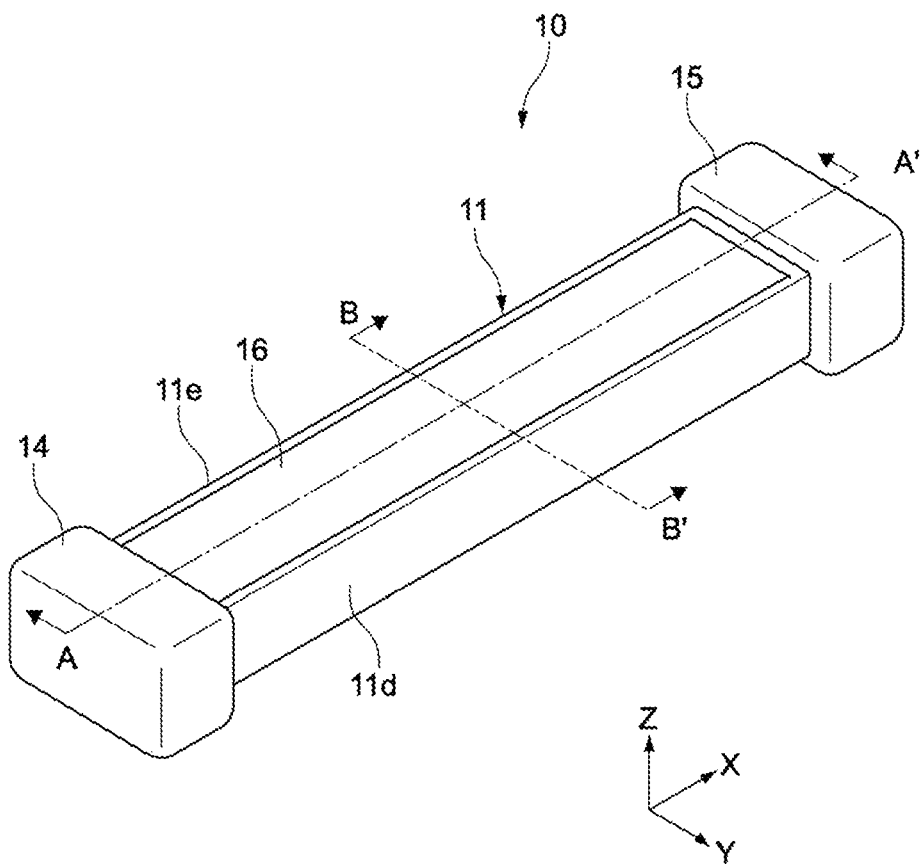
FIG. 1 is a perspective view of the multilayer piezoelectric element pertaining to an embodiment of the present invention.

DESCRIPTION OF THE SYMBOLS 10, 30—Multilayer piezoelectric element
11—Multilayer piezoelectric body
12, 13, 32, 33—Internal electrode
21, 41—Center internal electrode
22, 42—First cross-sectional shape
23, 43—Second cross-sectional shape
44—Marginal internal electrode
45—Third cross-sectional shape
50—Piezoelectric vibration apparatus
51—Vibration plate
52—Adhesive layer
60—Electronic device
61—Housing
62—Panel

DETAILED DESCRIPTION OF EMBODIMENTS

An embodiment of the present invention is explained below by referring to the drawings.

The drawings show, as deemed appropriate, the X-axis, Y-axis, and Z-axis crossing at right angles to each other. The X-axis direction corresponds to the "second-axis direction," the Y-axis direction corresponds to the "third-axis direction," and the Z-axis direction corresponds to the "first-axis direction." The X-axis, Y-axis, and Z-axis are the same in all drawings.

[Basic Constitution of Multilayer Piezoelectric Element]

Figure 2:
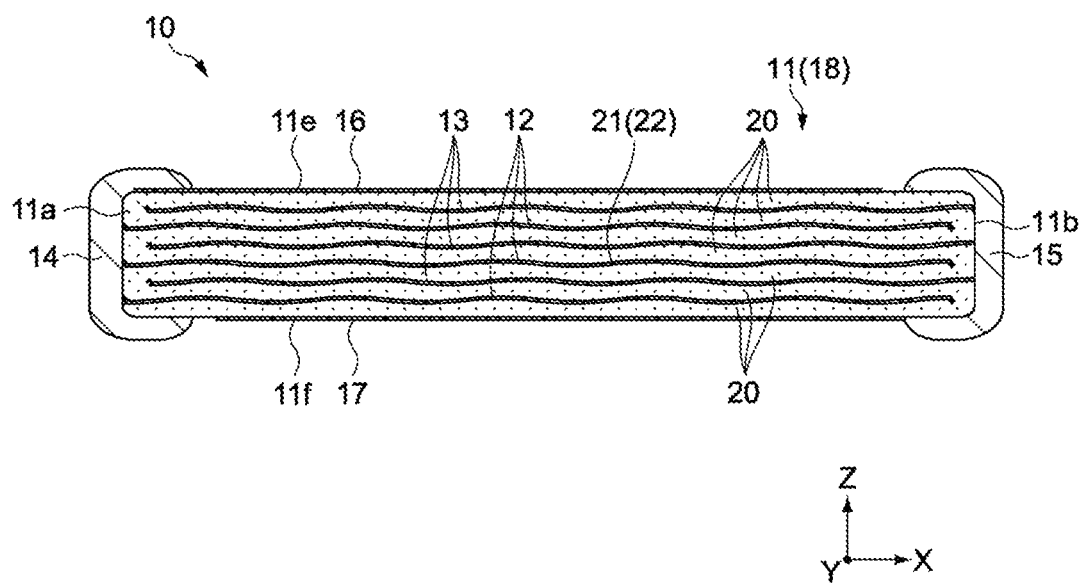
FIG. 2 is a cross-sectional view of the multilayer piezoelectric element along line A-A' in FIG. 1.
Figure 3:
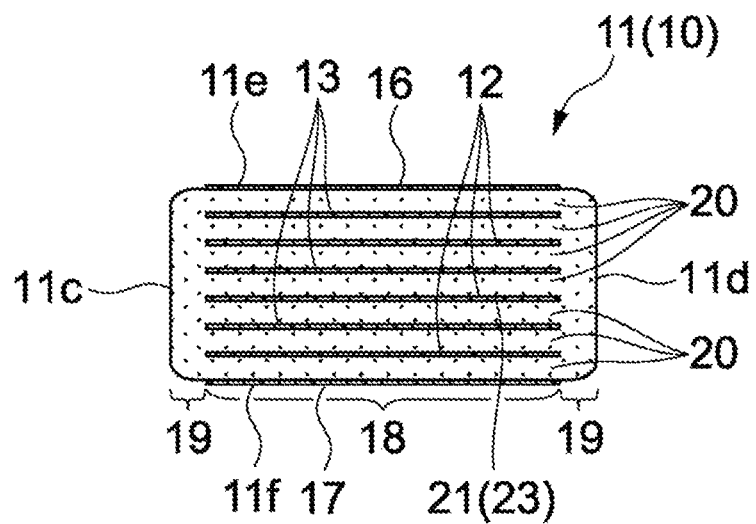
FIG. 3 is a cross-sectional view of the multilayer piezoelectric element along line B-B' in FIG. 1.
Figure 3:
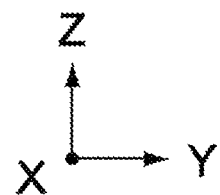

FIGS. 1 to 3 are drawings showing the multilayer piezoelectric element 10 pertaining to an embodiment of the present invention. FIG. 1 is a perspective view of the multilayer piezoelectric element 10. FIG. 2 is a cross-sectional view of the multilayer piezoelectric element 10 along line A-A' in FIG. 1. FIG. 3 is a cross-sectional view of the multilayer piezoelectric element 10 along line B-B' in FIG. 1.

The multilayer piezoelectric element 10 comprises a multilayer piezoelectric body 11, a first external electrode 14, a second external electrode 15, multiple first internal electrodes 12, multiple second internal electrodes 13, a first surface electrode 16, and a second surface electrode 17.

The multilayer piezoelectric body 11 is a multilayer body constituted by multiple piezoelectric layers 20, as described below. The multilayer piezoelectric body 11 has two end faces 11a, 11b facing the X-axis direction, two side faces 11c, 11d facing the Y-axis direction, and two principal faces 11e, 11f facing the Z-axis direction. Typically, each face is constituted roughly in a rectangular shape.

The multilayer piezoelectric body 11 has its longitudinal direction along the X-axis direction. This way, extension/contraction along the X-axis direction becomes dominant and consequently a multilayer piezoelectric element 10 having a piezoelectric constant of d31 can be constituted.

It should be noted that the shape of the multilayer piezoelectric body 11 need not be a rectangular solid, as shown in FIGS. 1 to 3. For example, the ridge parts connecting the respective faces of the multilayer piezoelectric body 11 may be chamfered. Also, each face of the multilayer piezoelectric body 11 may be a curved surface, and the multilayer piezoelectric body 11 may also have a rounded shape as a whole.

The multilayer piezoelectric body 11 has multiple electrodes placed on/in it to supply driving voltage. The external electrodes 14, 15 are placed on the end faces 11a, 11b of the multilayer piezoelectric body 11. The multiple internal electrodes 12, 13 are placed inside the multilayer piezoelectric body 11, and the surface electrodes 16, 17 are placed on its principal faces 11e, 11f, respectively. The first internal electrodes 12 and first surface electrode 16 are connected to the first external electrode 14, while the second internal electrodes 13 and second surface electrode 17 are connected to the second external electrode 15.

The multilayer piezoelectric body 11 has a piezoelectrically active part 18 and side margin parts 19. The side margin parts 19 cover the entire areas of both side faces of the piezoelectrically active part 18 facing the Y-axis direction. Also, the multilayer piezoelectric body 11 may have joint parts for joining the piezoelectrically active part 18 and the side margin parts 19, as necessary.

The piezoelectrically active part 18 has multiple piezoelectric layers 20 and is constituted in such a way that these piezoelectric layers 20 are stacked alternately with the multiple internal electrodes 12, 13 in the Z-axis direction. The first surface electrode 16 and second surface electrode 17 are placed on the outermost piezoelectric layers 20, respectively.

It should be noted that, strictly speaking, the area of the multilayer piezoelectric body 11 having piezoelectric activity refers to where the internal electrodes 12, 13 that are next to each other in the Z-axis direction and the surface electrodes 16, 17 are facing each other; here, however, the area up to the end faces 11a, 11b to which the internal electrodes 12, 13 and surface electrodes 16, 17 are led out, respectively, may be referred to as the piezoelectrically active part 18 as viewed in the Y-axis direction, for convenience unless stated otherwise.

The piezoelectric layers 20 are formed by a ceramic having piezoelectric characteristics. For such ceramic, a perovskite oxide whose primary component is lead zirconate titanate ($PbZrO_3$—$PbTiO_3$), or an oxide whose primary component is lithium niobate ($LiNbO_3$) or lithium tantalate ($LiTaO_3$), may be used, for example.

The side margin parts 19 are areas where there is no internal electrode 12, 13 or surface electrode 16, 17 and there is no piezoelectric activity. The side margin parts 19 function to protect the piezoelectrically active part 18 and ensure insulation property of the internal electrodes 12, 13 and surface electrodes 16, 17. The side margin parts 19 need only be formed by an insulating ceramic; however, use of a ceramic having piezoelectric characteristics, just like what is used for the piezoelectric layers 20, allows for reduction of internal stress in the multilayer piezoelectric body 11.

The internal electrodes 12, 13 are placed along the Z-axis direction alternately with, and between, the multiple piezoelectric layers 20 stacked in the Z-axis direction. The first internal electrodes 12 are connected to the first external electrode 14 and away from the second external electrode 15. The second internal electrodes 13 are connected to the second external electrode 15 and away from the first external electrode 14. This way, the internal electrodes 12, 13 that are next to each other in the Z-axis direction can apply driving voltage to the piezoelectric layer 20 between them. The internal electrodes 12, 13 are formed in a rectangular shape, for example.

The internal electrodes 12, 13 may be formed by a conductor whose primary component is silver (Ag) or silver-palladium (Pd) having low reactivity to piezoelectric ceramics, or a conductor that contains copper (Cu), platinum (Pt), etc. Or, any of these materials may contain a ceramic component or glass component.

The surface electrodes 16, 17 are placed on the outermost piezoelectric layers 20, respectively, with the first surface electrode 16 placed on the principal face 11e and the second surface electrode 17 placed on the principal face 11f. The first surface electrode 16 is connected to the first external electrode 14 and away from the second external electrode 15. The second surface electrode 17 is connected to the second external electrode 15 and away from the first external electrode 14.

The first surface electrode 16 can apply driving voltage to the piezoelectric layer 20 between it and the second internal electrode 13 closest to the principal face 11e. The second surface electrode 17 can apply driving voltage to the piezoelectric layer 20 between it and the first internal electrode 12 closest to the principal face 11f. There may be one or more piezoelectric layers 20 between the surface electrode 16, 17 and the outermost internal electrode 12, 13.

Because of the surface electrodes 16, 17, the piezoelectrically active area of the multilayer piezoelectric body 11 can be increased and the entire piezoelectric body 11 can be expanded/contracted.

The surface electrodes 16, 17 may be formed in a rectangular shape, respectively, just like the internal electrodes 12, 13 are; however, they may also have a prescribed pattern.

The surface electrodes 16, 17 may be formed by silver (Ag), or a silver compound where silver contains a glass, etc., whose primary component is silica (Si), or nickel (Ni), among others.

The external electrodes 14, 15 cover the end faces 11a, 11b of the multilayer piezoelectric body 11 and extend out onto the four faces (two side faces 11c, 11d and two principal faces 11e, 11f) connected to the end faces 11a, 11b. As a result, both of the external electrodes 14, 15 are such that the cross-section parallel with the X-Z plane, and the cross-section parallel with the X-Y plane, both have a U-shape. It should be noted that the external electrodes 14, 15 may be formed only on the end faces 11a, 11b.

The external electrodes 14, 15 are constituted by, for example, silver, or a silver compound where silver contains a glass, etc., whose primary component is silica, or nickel, among others.

Because of the aforementioned constitution, the multilayer piezoelectric element 10 is such that, when voltage is applied between the first external electrode 14 and the second external electrode 15, voltage applies to the multiple piezoelectric layers 20 present between the first internal electrodes 12 and the second internal electrodes 13. As a result, the multiple piezoelectric layers 20 expand/contract in the X-axis direction. Furthermore, voltage is also applied to the outermost piezoelectric layers 20 from the surface electrodes 16, 17, which allows the entire piezoelectrically active part 18 to expand/contract in the X-axis direction.

It should be noted that the basic constitution of the multilayer piezoelectric element 10 pertaining to this embodiment is not limited to the constitution shown in FIGS. 1 to 3 and may be modified as deemed appropriate. For example, the number of internal electrodes 12, 13 and the thickness of the piezoelectric layer 20 may be determined in any way as deemed appropriate according to the required size and performance of the multilayer piezoelectric element 10.

[Detailed Constitution of Internal Electrodes]

The multilayer piezoelectric element 10 is characterized in that the internal electrodes 12, 13 have multiple undulations along the X-axis direction which defines the longitudinal direction.

As shown in FIGS. 2 and 3, the internal electrodes 12, 13 have multiple undulations that are observed in the cross-section parallel with the X-axis direction, but not observed in the cross-section parallel with the Y-axis direction. Here, among the multiple internal electrodes 12, 13, the internal electrode placed at the center part of the multilayer piezoelectric body 11 is defined as a center internal electrode 21, and the constitution of the undulations is explained using the center internal electrode 21 as an example.

It should be noted that the center internal electrode 21 may be either a first internal electrode 12 or second internal electrode 13.

As shown in FIG. 2, the cross-section as viewed from the Y-axis direction (that is, the cross-section parallel with the X-axis direction and crossing at right angles with the Y-axis direction), of the center internal electrode 21, is specified as a first cross-sectional shape 22. On the other hand, as shown in FIG. 3, the cross-section as viewed from the X-axis direction (that is, the cross-section parallel with the Y-axis direction and crossing at right angles with the X-axis direction), of the center internal electrode 21, is specified as a second cross-sectional shape 23. As shown in these figures, the first cross-sectional shape 22 has multiple undulations that rise and fall with respect to the Z-axis direction, but the second cross-sectional shape 23 is constituted roughly flat. In other words, the first cross-sectional shape 22 has greater undulations than undulations, if any, of the second cross-sectional shape 23. Because of this, it can be said that wave-like undulations having ridgelines along the Y-axis direction and moving in the X-axis direction are formed on the electrode face of the center internal electrode 21.

It suffices that at least the center internal electrode 21 has these undulations; however, all internal electrodes 12, 13 may also have these undulations, as shown in FIG. 2. Or, only one or more internal electrodes 12, 13, including the center internal electrode 21, may have these undulations. The internal electrodes 12, 13 may have undulations of roughly the same shapes, or of different shapes.

The microscopic shape of the center internal electrode 21 is explained further.

Figure 4:
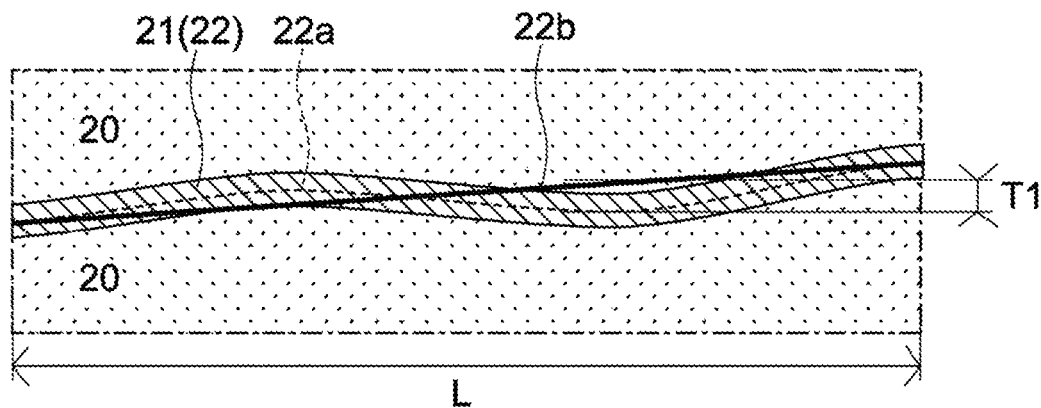
FIG. 4 is an enlarged view of FIG. 2, illustrating a microstructure of the cross-sectional shape of the multilayer piezoelectric element.
Figure 4:
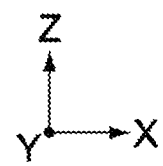
Figure 5:
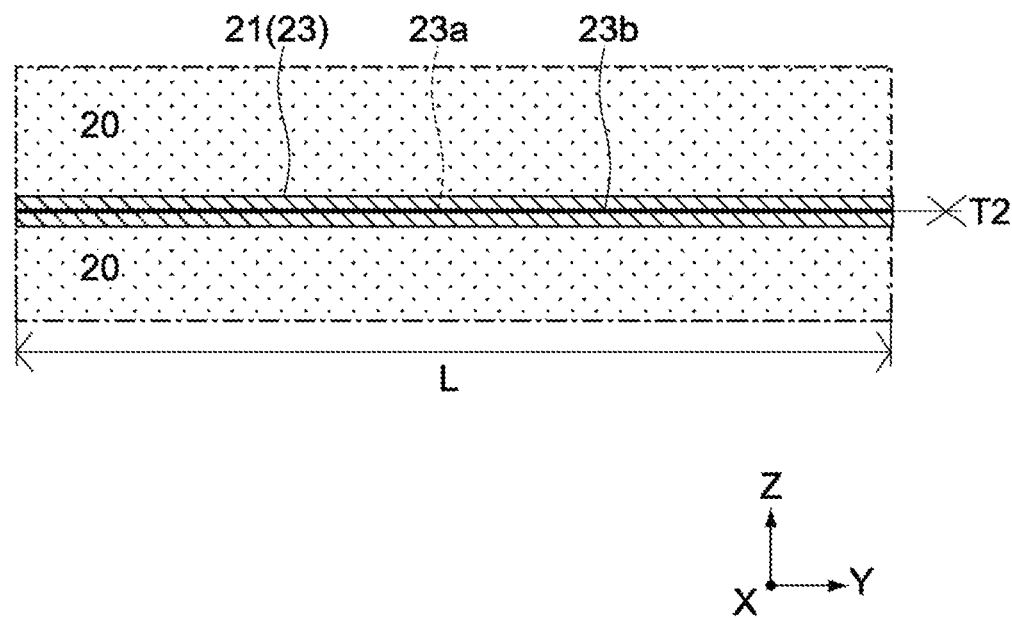
FIG. 5 is an enlarged view of FIG. 3, illustrating a microstructure of the cross-sectional shape of the multilayer piezoelectric element.

FIGS. 4 and 5 are each a cross-sectional view of the multilayer piezoelectric body 11 observed with a scanning electron microscope in a view field of 50 µm long×250 µm wide. FIG. 4 corresponds to an enlarged view of FIG. 2, showing the cross-sectional shape of the multilayer piezoelectric body 11 crossing at right angles with the Y-axis direction at the center part in the X-axis direction and Z-axis direction. FIG. 5 corresponds to an enlarged view of FIG. 3, showing the cross-sectional shape of the multilayer piezoelectric body 11 crossing at right angles with the X-axis direction at the center part in the Y-axis direction and Z-axis direction. FIGS. 4 and 5 both show the center internal electrode 21, with FIG. 4 showing a part of the first cross-sectional shape 22 and FIG. 5 showing a part of the second cross-sectional shape 23.

As shown in FIG. 4, a virtual line (figure line) running along the center of the center internal electrode 21 in first cross-sectional shape 22 in the Z-axis direction and having a length of 100 µm (L) in the X-axis direction, is specified as a first running line 22a. Also, a virtual straight line (straight figure line) connecting the end points of the first running line 22a is specified as a first reference line 22b. In the first cross-sectional shape 22, the first running line 22a diverges from the first reference line 22b in the Z-axis direction. The maximum dimension of divergence T1 of the first running line 22a relative to the first reference line 22b in the Z-axis direction is 2 µm or greater, for example. The reference line is an approximate line which can be geometrically determined, e.g., in a manner described above (connecting the end points of the cross section of the center internal electrode equivalent to 1.5 or more cycles of undulations of the center internal electrode when considering the undulations to follow a sinusoidal pattern or the like) or can be determined using, e.g., the least-squares method.

On the other hand, as shown in FIG. 5, a running line and a reference line are also specified for the center internal electrode 21 in second cross-sectional shape 23, just like for the first cross-sectional shape 22. To be specific, a virtual line (figure line) running along the center of the center internal electrode 21 in second cross-sectional shape 23 in the Z-axis direction and having a length of 100 µm (L) in the Y-axis direction, is specified as a second running line 23a. Also, a virtual straight line (straight figure line) connecting the end points of the second running line 23a is specified as a second reference line 23b. As shown in this figure, in the second cross-sectional shape 23 the second running line 23a practically does not diverge with respect to the second reference line 23b in the Z-axis direction, and the maximum dimension of divergence T2 of the second running line 23a with respect to the second reference line 23b along the Z-axis direction is approx. 0 µm. In other words, the maximum dimension of divergence T1 is greater than the maximum dimension of divergence T2.

As described above, the center internal electrode 21 has multiple micro-undulations that are observed in the first cross-sectional shape 22, but not observed in the second cross-sectional shape 23. Through an experiment, it was found that applying voltage to the multilayer piezoelectric body 11 of the aforementioned constitution would increase the displacement amount in the X-axis direction. The results of this experiment are explained below.

Figure 6:
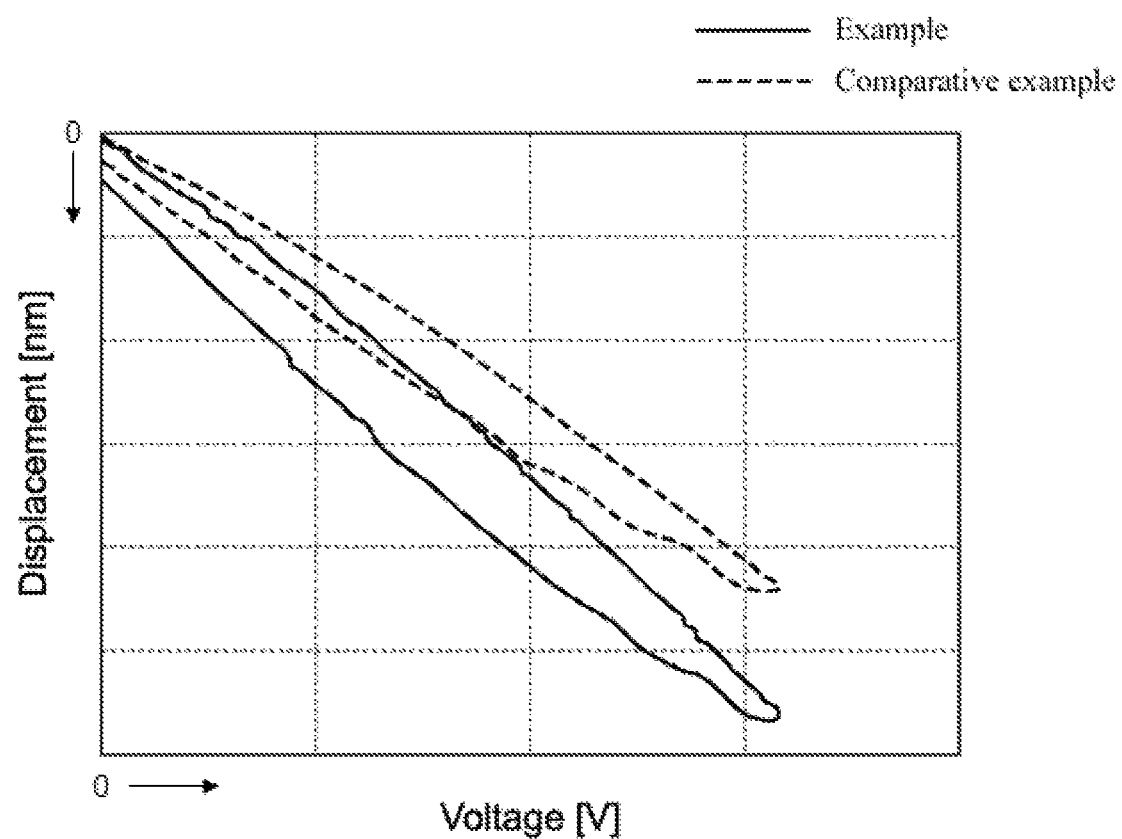
FIG. 6 is a graph showing an experimental result of voltage value vs. displacement amount.

FIG. 6 is a graph showing the relationship (hysteresis) between the value of voltage applied to the external electrodes, and the amount of displacement, of a multilayer piezoelectric element, where the horizontal axis represents the voltage value [V] (arbitrary scale) and the vertical axis represents the displacement amount [nm] (arbitrary scale) in the X-axis direction. Also, the solid line represents the result of a multilayer piezoelectric element whose center internal electrode 21 has undulations, pertaining to an example of this embodiment. The broken line represents the result of a multilayer piezoelectric element whose internal electrodes are generally flat, pertaining to a comparative example of this embodiment.

As shown in this graph, the multilayer piezoelectric elements pertaining to the example displaced approx. 20% more in the X-axis direction, compared to the multilayer piezoelectric elements pertaining to the comparative example, when the same voltage was applied. This can be explained by several reasons, one of which is that the undulations increase the surface area of the internal electrodes 12, 13, thus making the driving current higher when the same voltage is applied. There may be multiple other factors at play, including a contribution of the electric field distribution, and a drop in the piezoelectric body binding force due to the internal electrodes.

[Basic Method for Manufacturing Multilayer Piezoelectric Element 10]

Figure 7:
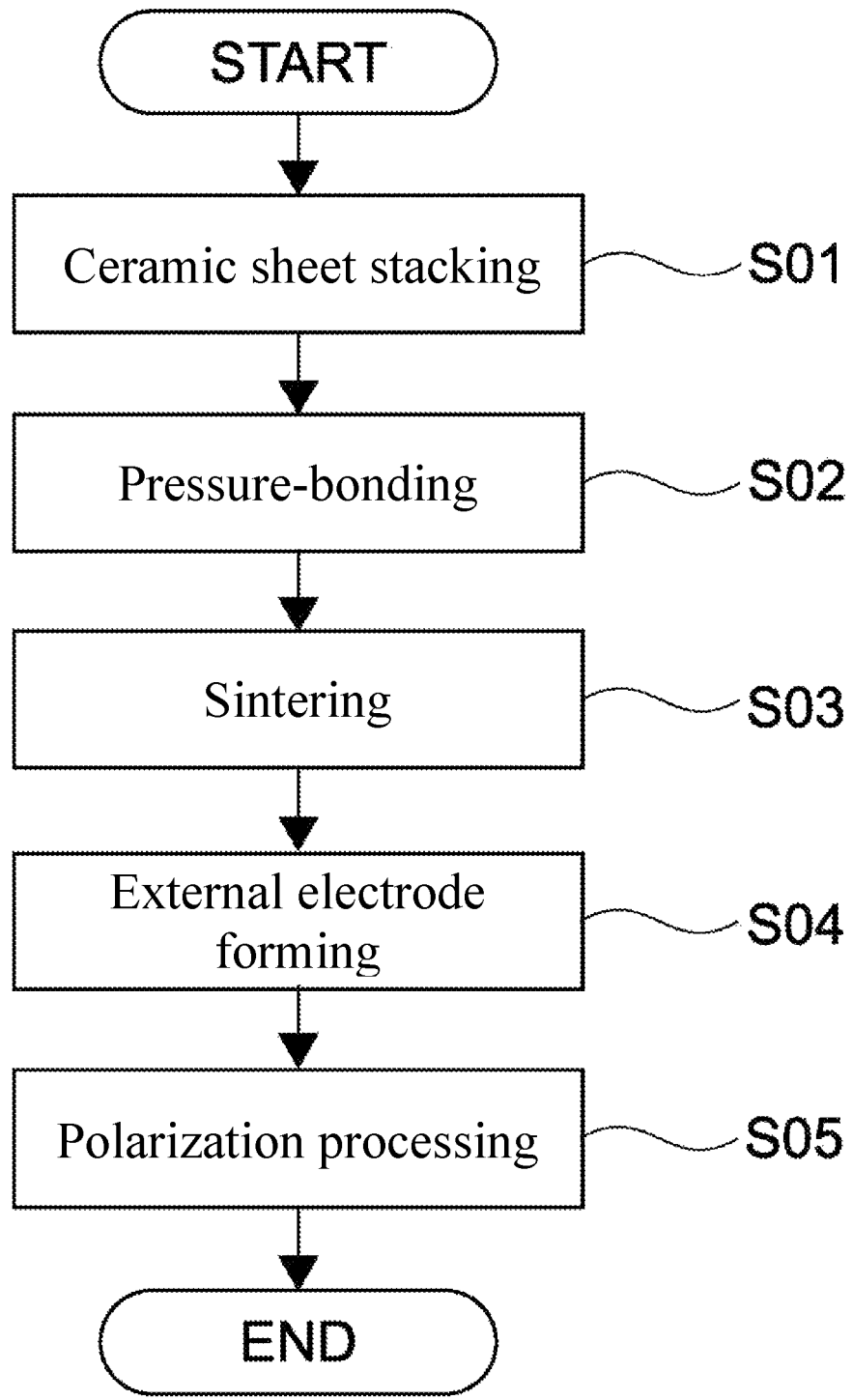
FIG. 7 is a flow chart showing a method for manufacturing the multilayer piezoelectric element.
Figure 8:
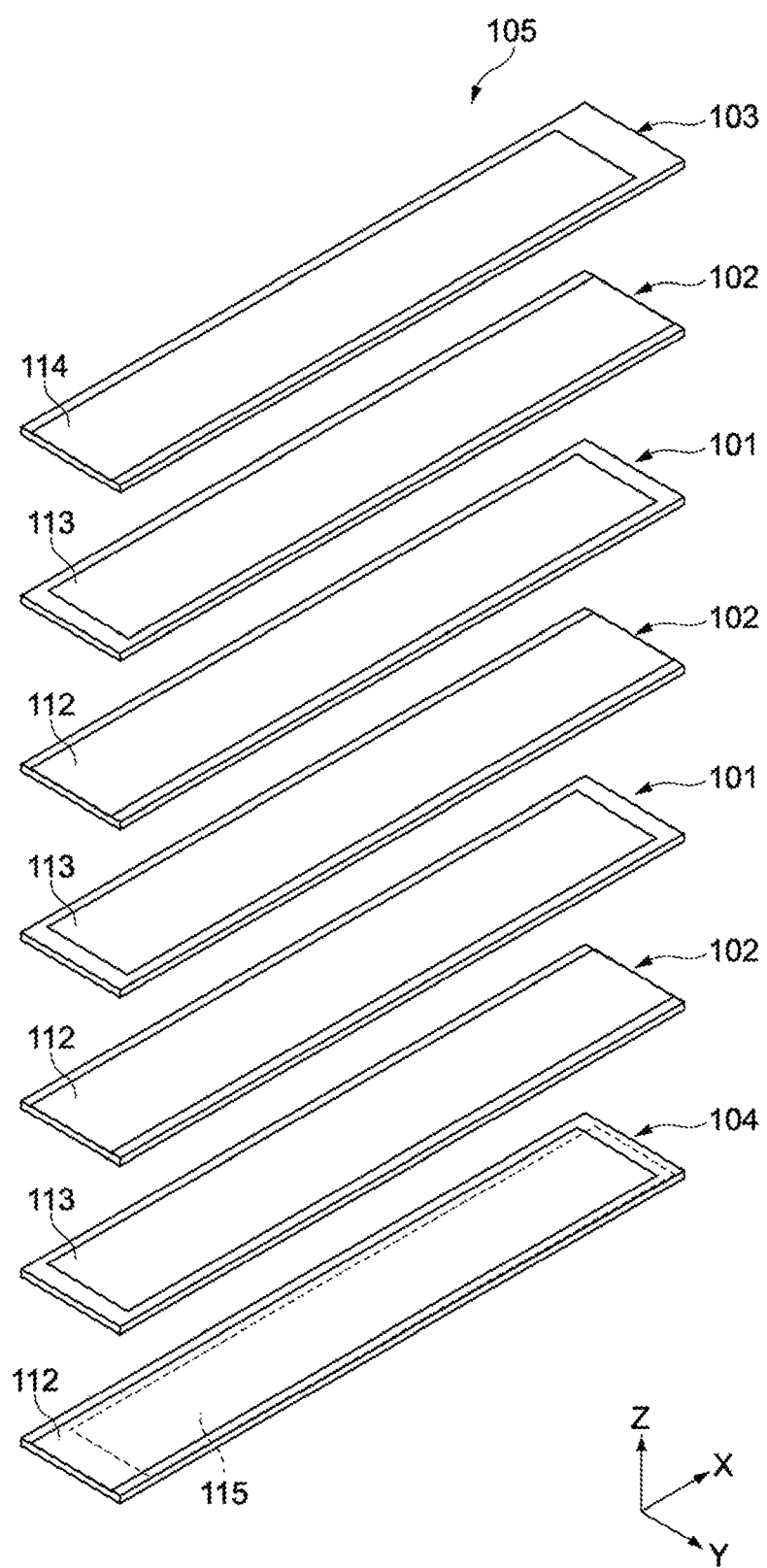
FIG. 8 is a perspective view showing a process for manufacturing the multilayer piezoelectric element.
Figure 9:
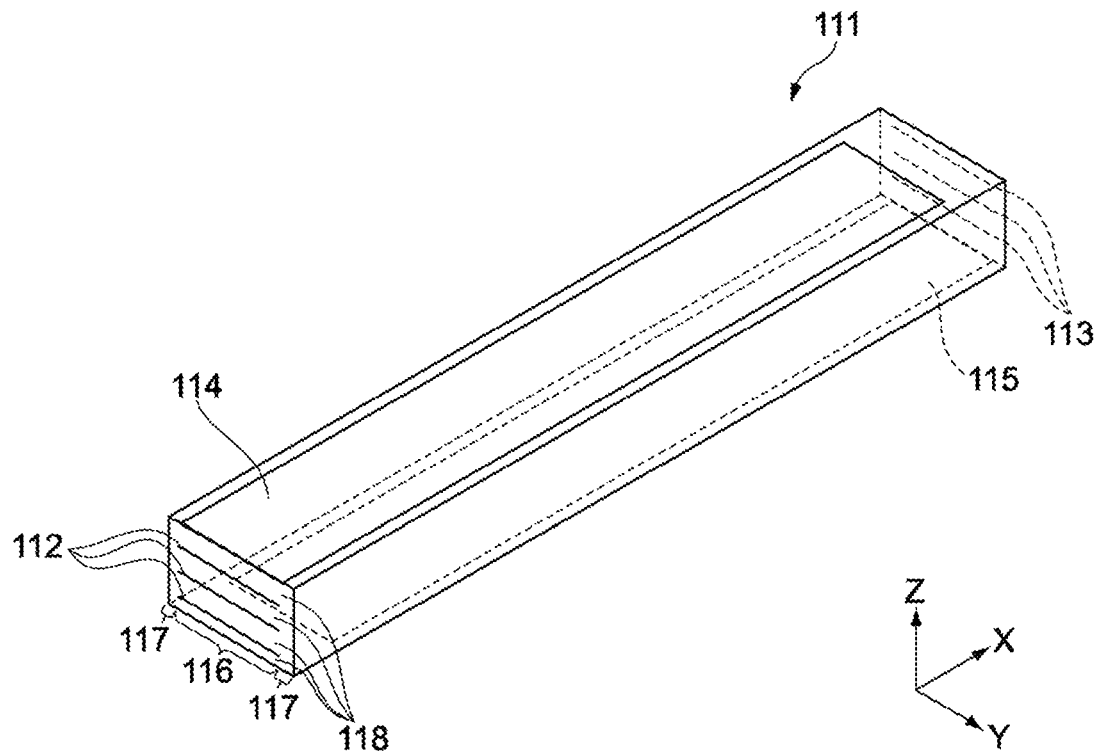
FIG. 9 is a perspective view showing a process for manufacturing the multilayer piezoelectric element.

FIG. 7 is a flow chart showing the method for manufacturing the multilayer piezoelectric element 10. FIGS. 8 and 9 are drawings showing the process for manufacturing the multilayer piezoelectric element 10. The following explains the basic method for manufacturing the multilayer piezoelectric element 10, according to FIG. 7, by referring to FIGS. 8 and 9 as deemed appropriate.

(Step S01: Ceramic Sheet Stacking)

In step S01, first ceramic sheets 101, second ceramic sheets 102, third ceramic sheet 103 and fourth ceramic sheet 104 are stacked, as shown in FIG. 8, to produce a ceramic multilayer body 105 for forming a multilayer piezoelectric body 11. In this step, the first ceramic sheets 101 and second ceramic sheets 102 are stacked alternately in the Z-axis direction, after which the third ceramic sheet 103 and fourth ceramic sheet 104 are stacked on the top face and bottom face of this multilayer body, respectively. It should be noted that the number of each type of ceramic sheets to be stacked is not limited to the example in FIG. 8.

The ceramic sheets 101, 102, 103, 104 are constituted as unsintered piezoelectric green sheets whose primary component is a piezoelectric ceramic. The piezoelectric green sheets are prepared by mixing a calcined (temporarily baked) powder of piezoelectric ceramic, a binder constituted by organic polymers, and a plasticizer, to produce a ceramic slurry, and then forming the slurry into sheet shapes using a roll coater, doctor blade, etc., for example.

As shown in FIG. 8, unsintered first internal electrodes 112 corresponding to the first internal electrodes 12 are formed on the first ceramic sheets 101, and unsintered second internal electrodes 113 corresponding to the second internal electrodes 13 are formed on the second ceramic sheets 102. Also, an unsintered first surface electrode 114 corresponding to the first surface electrode 16 is formed on the third ceramic sheet 103. An unsintered first internal electrode 112 corresponding to the first internal electrode 12 is formed on one face, and an unsintered second surface electrode 115 corresponding to the second surface electrode 17 is formed on the other face, of the fourth ceramic sheet 104.

The internal electrodes 112, 113 and surface electrodes 114, 115 may be formed by applying a desired conductive paste onto the ceramic sheets 101, 102, 103, 104. For the method for applying the conductive paste, any known art can be selected as desired, and, for example, the screen printing method or gravure printing method may be used.

It should be noted that one or more ceramic sheets on which no conductive paste is applied can be placed between the ceramic sheets 103, 104 and the multilayer structure comprising the ceramic sheets 101, 102. This allows the thickness of the piezoelectric layers 20 between the surface electrodes 16, 17 and the internal electrodes 12, 13 to be adjusted. It should be noted that, in this case, no internal electrode is formed, and only the second surface electrode 115 is formed, on the fourth ceramic sheet 104.

(Step S02: Pressure-Bonding)

In step S02, the ceramic multilayer body 105 is pressure-bonded. As a result, the ceramic sheets 101, 102, 103, 104 are integrated, to form an unsintered multilayer chip 111 as shown in FIG. 9. The multilayer chip 111 corresponds to a pre-sintered, pre-polarized form of the multilayer piezoelectric body 11. Preferably uniaxial pressurization, hydrostatic pressurization, etc., are used for the pressure-bonding of the ceramic multilayer body 105. This way, the multilayer chip 111 can be made denser.

FIG. 9 is a perspective view of the multilayer chip 111 obtained in step S02. The multilayer chip 111 has the piezoelectrically live part 116 and side margin parts 117 formed in it. The ceramic layers 118 are formed between the internal electrodes 112, 113, and the surface electrodes 114, 115 are formed on the topmost face and bottommost face, respectively.

It should be noted that a pressure-bonded multilayer sheet in which multiple areas corresponding to multilayer chips 111 are formed, may be cut into individual multilayer chips 111. In this case, the ceramic sheets constituting the multilayer sheet have electrode patterns corresponding to multiple internal electrodes and surface electrodes. This way, multiple multilayer chips may be produced from a single multilayer sheet.

Also, a multilayer body consisting only of a piezoelectrically live part 116 may be formed first, and side margin parts 117 may be formed subsequently on both side faces of the multilayer body.

(Step S03: Sintering)

In step S03, the unsintered multilayer chip 111 obtained in step S02 is sintered, to produce a multilayer chip corresponding to the multilayer piezoelectric body 11. The multilayer chip obtained in this step corresponds to a pre-polarization form (prior to polarization) of the multilayer piezoelectric body 11 and has the same constitution as the multilayer piezoelectric body 11 shown in FIGS. 1 to 3.

Which sintering method to be used in step S03 can be determined according to the composition and sintering temperature of the multilayer chip 111. For example, binder removal processing at 300 to 500° C. may be followed by sintering at approx. 900 to 1200° C. Also, sintering may be performed in a reducing ambience, standard or air ambience, or ambience of low oxygen partial pressure.

(Step S04: External Electrode Forming)

In step S04, external electrodes 14, 15 are formed on the multilayer chip obtained in step S03, to produce a ceramic element corresponding to the multilayer piezoelectric element 10. The ceramic element obtained in this step corresponds to a pre-polarization (prior to polarization) form of the multilayer piezoelectric element 10 and has the same constitution as the multilayer piezoelectric element 10 shown in FIGS. 1 to 3.

In step S04, an unsintered electrode material is applied in a manner covering both end faces of the sintered multilayer chip in the X-axis direction, for example. The electrode material may be a conductive paste whose primary component is silver (Ag), for example. When the applied, unsintered electrode material is baked in a reducing ambience, standard or air ambience, or ambience of low oxygen partial pressure, for example, external electrodes 14, 15 are formed. It should be noted that any method, such as the sputtering method, vacuum deposition method, etc., may be used in the forming of external electrodes 14, 15, so long as it achieves good adhesion and good conductivity to the internal electrodes and surface electrodes.

It should be noted that a part of the processing in step S04 above may be performed before step S03. For example, an unsintered electrode material may be applied to both end faces of the unsintered multilayer chip 111 in the X-axis direction before step S03. This way, sintering of the unsintered multilayer chip 111, and baking of the electrode material, can be performed simultaneously in step S03.

(Step S05: Polarization Processing)

In step S05, the sintered multilayer chip is put through polarization processing to provide piezoelectric activity. Under the polarization processing, voltage may be applied to the multilayer piezoelectric body 11 using the external electrodes 14, 15, or another power supply member may be connected to the internal electrodes 12, 13 and surface electrodes 16, 17 to apply voltage.

Based on the above, a multilayer piezoelectric element 10 is manufactured.

It should be noted that step S05 may be performed before step S04. In this case, a power supply member is connected to the internal electrodes 12, 13 and surface electrodes 16, 17 to apply voltage. This is another way to put the sintered multilayer piezoelectric body 11 through polarization processing.

[Method for Manufacturing Internal Electrodes]

The internal electrodes 12, 13 of the multilayer piezoelectric element 10 pertaining to this embodiment may be manufactured as described below.

For example, uniaxial pressurization may be performed using a press machine equipped with rubber sheets made of elastically deformable rubber, in the pressure-bonding step of S02. To be specific, the rubber sheets are installed on both the top plate and bottom plate of the press machine, and then the ceramic multilayer body 105 is placed between these rubber sheets to uniaxially pressurize it. The rubber sheets deform elastically under pressure due to the very small differences in the thicknesses of the ceramic multilayer body 105, etc. Pressure-bonding implemented between the deformed rubber sheets allows for forming of internal electrodes 112, 113 having undulations.

Alternatively, the green sheet or internal electrode composition may be adjusted to form internal electrodes 12, 13 by utilizing the different rates at which the green sheet and conductive paste shrink at the time of sintering. Or, adjustment of material composition and use of rubber sheets for pressure-bonding may be combined.

Variation Example

Figure 10:
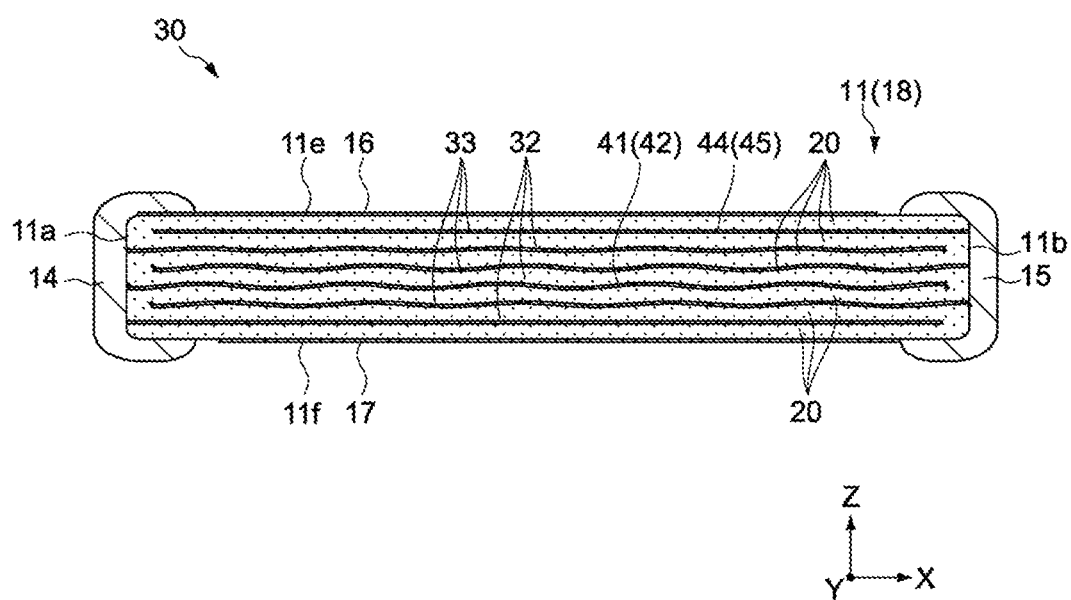
FIG. 10 is a cross-sectional view of the multilayer piezoelectric element pertaining to a variation example of the aforementioned embodiment, corresponding to FIG. 2.
Figure 11:
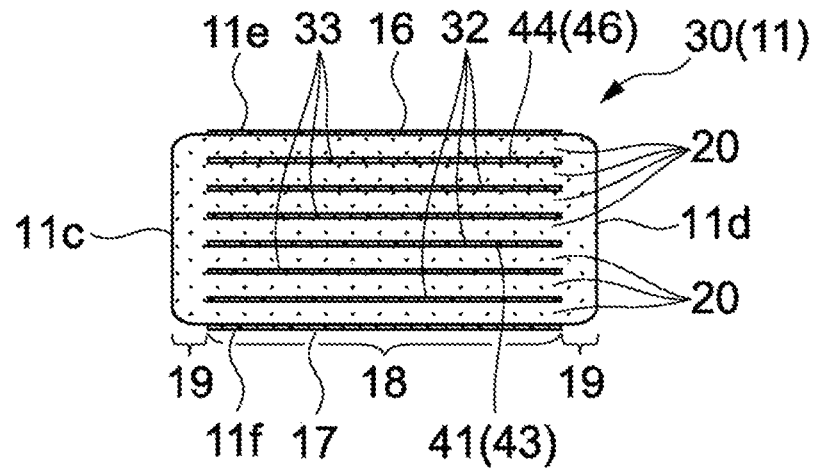
FIG. 11 is a cross-sectional view of the multilayer piezoelectric element, corresponding to FIG. 3.
Figure 11:
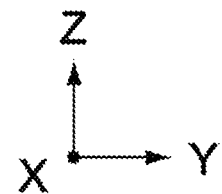

FIGS. 10 and 11 show the constitution of the multilayer piezoelectric element 30 pertaining to a variation example of this embodiment. FIG. 10 is a view of a cross-section crossing at right angles with the Y-axis direction and corresponds to FIG. 2. FIG. 11 is a view of a cross-section crossing at right angles with the X-axis direction and corresponds to FIG. 3. The multilayer piezoelectric element 30 comprises a multilayer piezoelectric body 11, a first external electrode 14, a second external electrode 15, multiple first internal electrodes 32, multiple second internal electrodes 33, a first surface electrode 16, and a second surface electrode 17, and is different from the multilayer piezoelectric element 10 in how the internal electrodes 32, 33 are constituted. Below, areas that are constituted similarly are denoted using the same symbols and are not explained.

In this variation example, undulations similar to those of the center internal electrode 21 are formed on the electrode face of, among the internal electrodes 32, 33, the center internal electrode 41 placed at the center part of the multilayer piezoelectric body 11. In contrast, among the internal electrodes 32, 33, the marginal internal electrode 44 placed at the position closest to the principal face 11e is formed roughly flat as a whole. It should be noted that the center internal electrode 41 and marginal internal electrode 44 may each be either a first internal electrode 32 or a second internal electrode 33. Also, the marginal internal electrode 44 may be one of the internal electrodes 32, 33 placed at the position closest to the principal face 11f.

As shown in FIG. 10, the cross-section as viewed from the Y-axis direction (that is, the cross-section parallel with the X-axis direction and crossing at right angles with the Y-axis direction), of the center internal electrode 41, is specified as a first cross-sectional shape 42. Also, as shown in FIG. 11, the cross-section as viewed from the X-axis direction (that is, the cross-section parallel with the Y-axis direction and crossing at right angles with the X-axis direction), of the center internal electrode 41, is specified as a second cross-sectional shape 43. As shown in these figures, the first cross-sectional shape 42 has multiple undulations that rise or fall with respect to the Z-axis direction, but the second cross-sectional shape 43 is constituted roughly flat. Because of this, it can be said that wave-like undulations having ridgelines along the Y-axis direction and moving in the X-axis direction are formed also on the electrode face of the center internal electrode 41.

On the other hand, the cross-section as viewed from the Y-axis direction (that is, the cross-section parallel with the X-axis direction and crossing at right angles with the Y-axis direction), of the marginal internal electrode 44, is defined as a third cross-sectional shape 45, as shown in FIG. 10, while the cross-section as viewed from the X-axis direction (that is, the cross-section parallel with the Y-axis direction and crossing at right angles with the X-axis direction), of the marginal internal electrode 44, is defined as a fourth cross-sectional shape 46, as shown in FIG. 11. As shown in these figures, both the third cross-sectional shape 45 and fourth cross-sectional shape 46 are constituted roughly flat. Because of this, it can be said that the marginal internal electrode 44 is constituted flat as a whole.

The microscopic shapes of the center internal electrode 41 and marginal internal electrode 44 are explained further.

Figure 12:
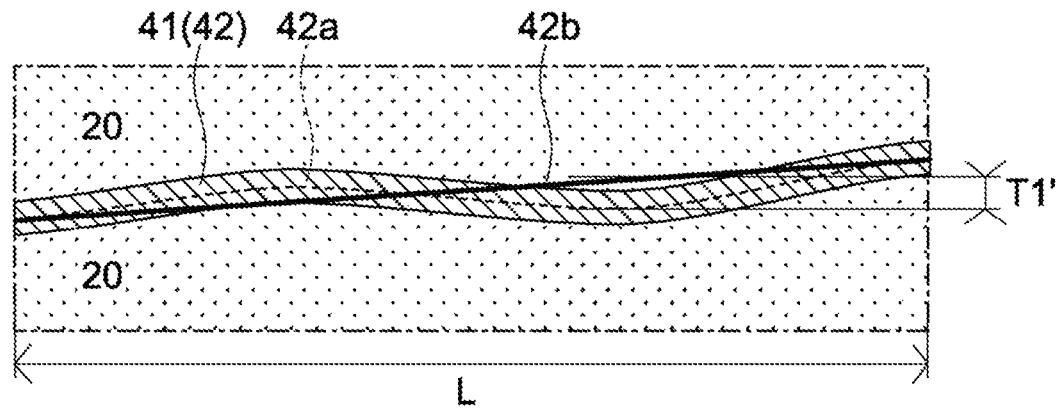
FIG. 12 is an enlarged view of FIG. 10, illustrating a microstructure of the cross-sectional shape of the multilayer piezoelectric element.
Figure 12:
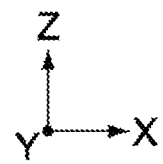
Figure 13:
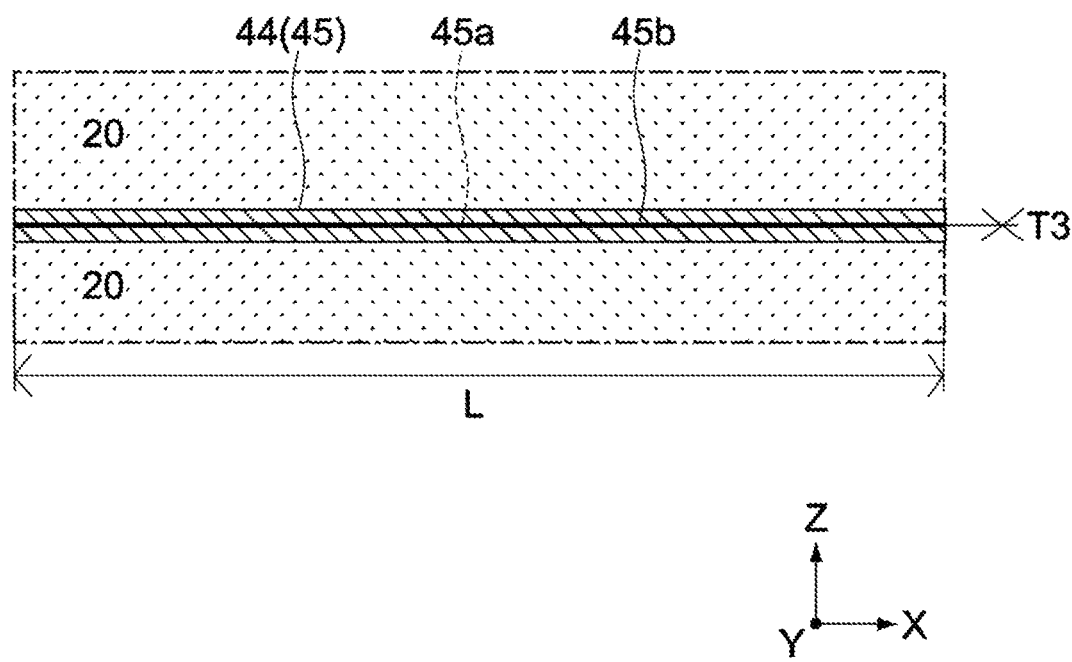
FIG. 13 is another enlarged view of FIG. 10, illustrating a microstructure of the cross-sectional shape of the multilayer piezoelectric element.

FIGS. 12 and 13 are each a cross-sectional view of the multilayer piezoelectric body 11 observed with a scanning electron microscope in a view field of 50 μm long×250 μm wide. FIG. 12 corresponds to an enlarged view of FIG. 10, showing the cross-sectional shape of the multilayer piezoelectric body 11 crossing at right angles with the Y-axis direction at the center part in the X-axis direction and Z-axis direction. FIG. 13 also corresponds to an enlarged view of FIG. 10, showing the cross-sectional shape of the multilayer piezoelectric body 11 at the center part in the Y-axis direction and also near the principal face 11e. FIG. 12 shows a part of the first cross-sectional shape 42 of the center internal electrode 41, and FIG. 13 shows a part of the third cross-sectional shape 45 of the marginal internal electrode 44.

As shown in FIG. 12, a virtual line running along the center of the first cross-sectional shape 42 in the Z-axis direction and having a length of 100 μm (L) in the X-axis direction, is specified as a first running line 42a. Also, a virtual straight line connecting the end points of the first running line 42a is specified as a first reference line 42b. In the first cross-sectional shape 42, the first running line 42a diverges from the first reference line 42b in the Z-axis direction. The maximum dimension of divergence T1' of the first running line 42a relative to the first reference line 42b in the Z-axis direction is 2 μm or greater, for example.

On the other hand, as shown in FIG. 13, a running line and a reference line are also specified for the third cross-sectional shape 45. To be specific, a virtual line running along the center of the third cross-sectional shape 45 in the Z-axis direction and having a length of 100 μm (L) in the X-axis direction, is specified as a third running line 45a. Also, a virtual straight line connecting the end points of the third running line 45a is specified as a third reference line 45b. As shown in this figure, in the third cross-sectional shape 45 the third running line 45a practically does not diverge with respect to the third reference line 45b in the Z-axis direction, and the maximum dimension of divergence T3 of the third running line 45a with respect to the third reference line 45b along the Z-axis direction is approx. 0 μm. In other words, the maximum dimension of divergence T1' is greater than the maximum dimension of divergence T3.

As described above, undulations may not be formed on the marginal internal electrodes 44 near the principal faces 11e, 11f, so long as undulations are formed on the center internal electrode 41 placed at the center part. Through an experiment similar to the experiment explained using FIG. 6, it was confirmed that this constitution, too, could increase the displacement amount of the multilayer piezoelectric body 11.

It should be noted that only one or more internal electrodes 32, 33 placed at the center part of the multilayer piezoelectric body 11 may have undulations, or the internal electrodes 32, 33 may be constituted so that their undulations become progressively smaller toward near the principal faces 11e, 11f, from the center part.

[Piezoelectric Vibration Apparatus]

The multilayer piezoelectric element 10 can be widely used as a piezoelectric actuator that operates in the X-axis direction by means of the transverse piezoelectric effect. One example of application of the multilayer piezoelectric element 10 is a piezoelectric vibration apparatus that generates vibration. The following explains a unimorph piezoelectric vibration apparatus 50 constituted with the multilayer piezoelectric element 10.

Figure 14:
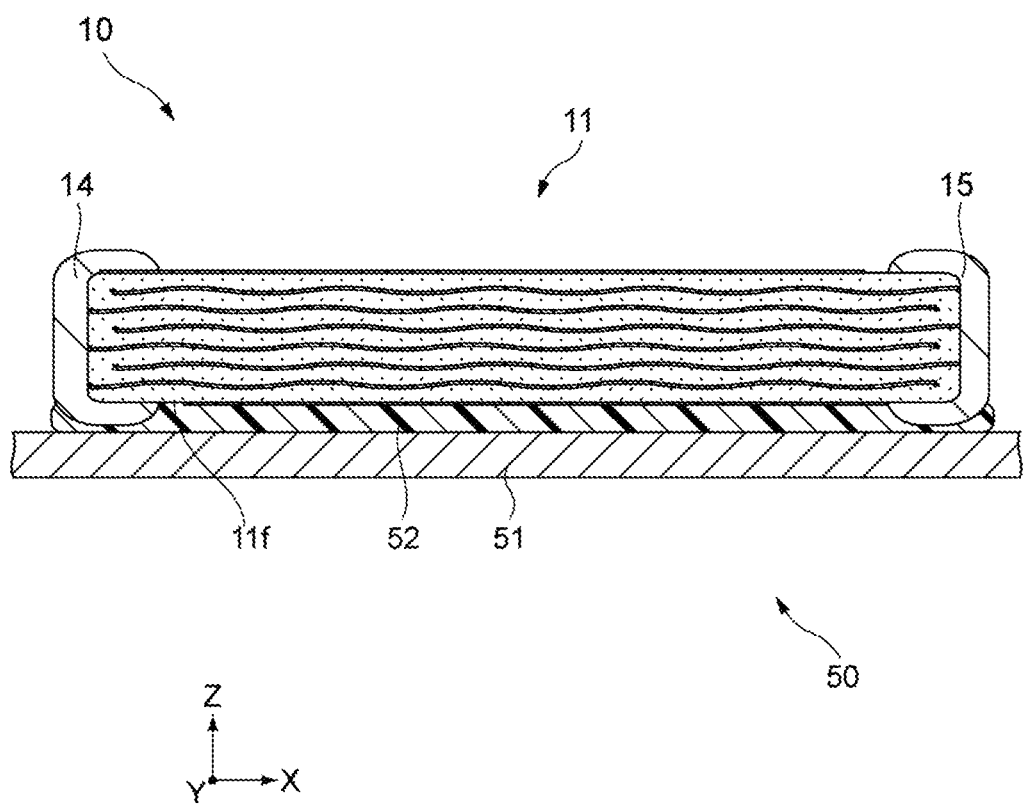
FIG. 14 is a cross-sectional view of a piezoelectric vibration apparatus that uses the multilayer piezoelectric element.

FIG. 14 is a cross-sectional view of the piezoelectric vibration apparatus 50. The piezoelectric vibration apparatus 50 comprises the multilayer piezoelectric element 10, a vibration plate 51, and an adhesive layer 52. The vibration plate 51 is constituted as a flat plate extending along the XY plane and is placed in a manner facing the first principal face 11e of the multilayer piezoelectric element 10. The adhesive layer 52 is placed between the multilayer piezoelectric element 10 and the vibration plate 51.

The vibration plate 51 is formed by metal, glass, etc., and has flexibility in the Z-axis direction, for example. The adhesive layer 52 is formed by resin material, etc., and joins the multilayer piezoelectric element 10 and the vibration plate 51. The adhesive layer 52 adheres to the bottom part of the multilayer piezoelectric element 10 in the Z-axis direction, and to the top face of the vibration plate 51 in the Z-axis direction.

The adhesive layer 52 fills the space between the first principal face 11e of the multilayer piezoelectric body 11 and the vibration plate 51, and joins the multilayer piezoelectric body 11 and the vibration plate 51 over a wide range. This allows the piezoelectric vibration apparatus 50 to have high joining strength, via the adhesive layer 52, between the multilayer piezoelectric element 10 and the vibration plate 51.

The piezoelectric vibration apparatus 50 is such that, because of its high joining strength between the multilayer piezoelectric element 10 and the vibration plate 51 due to the adhesive layer 52, the multilayer piezoelectric element 10 does not easily separate from the vibration plate 51 even when the multilayer piezoelectric element 10 is caused to expand/contract significantly. As a result, the vibration plate 51 maintains a high vibration in the piezoelectric vibration apparatus 50.

[Electronic Device]

Figure 15A:
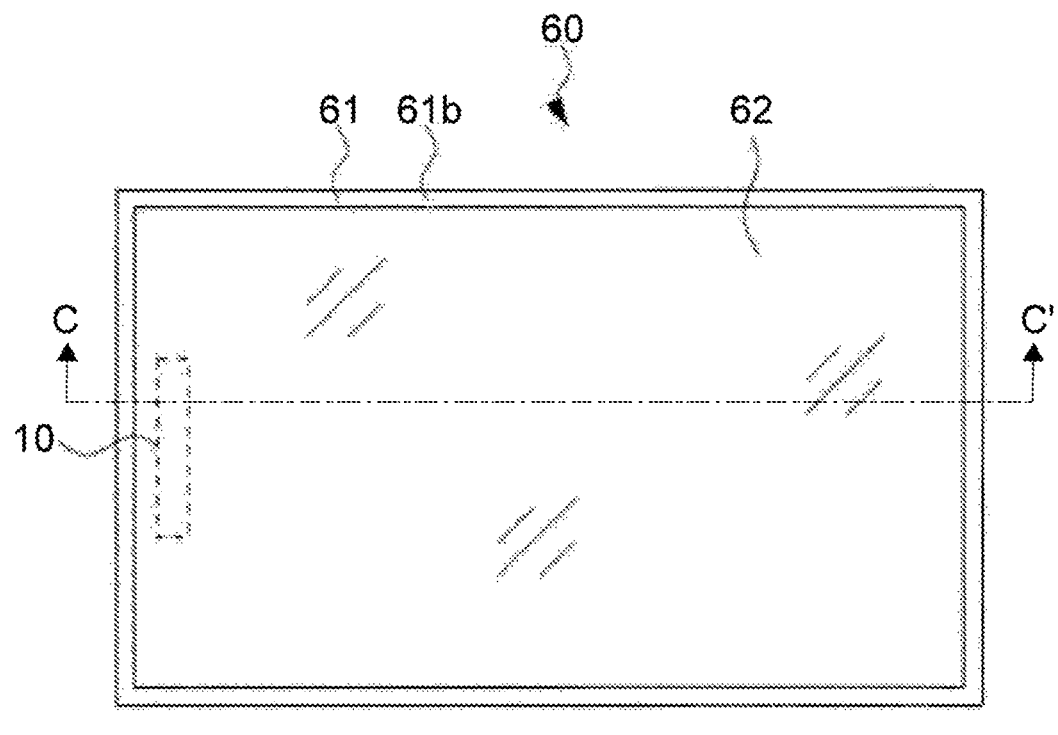
FIG. 15A is a plan view of an electronic device that uses the multilayer piezoelectric element.
Figure 15B:
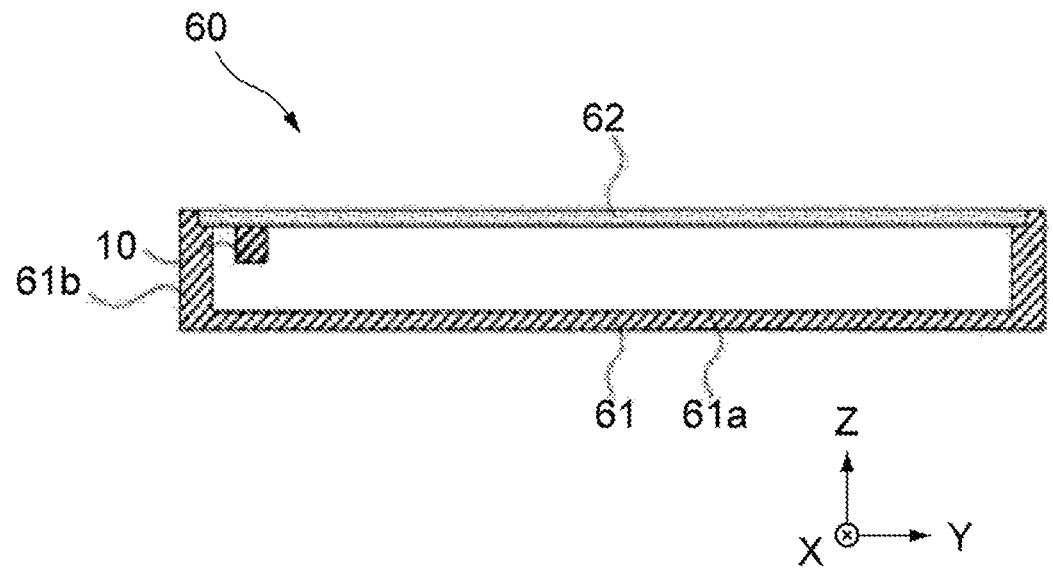
FIG. 15B is a cross-sectional view of the electronic device along line C-C' in FIG. 15A.

FIGS. 15A and 15B are schematic views of an electronic device 60 that uses the multilayer piezoelectric element 10. FIG. 15A is a plan view of the electronic device 60. FIG. 15B is a cross-sectional view of the electronic device 60 along line C-C' in FIG. 15A. The electronic device 60 is generally constituted as a multifunctional mobile communication terminal called "smartphone."

The electronic device 60 has the multilayer piezoelectric element 10, a housing 61, and a panel 62. The housing 61 has a bottom plate 61a extending rectangularly along the XY plane and a frame body 61b extending upward in the Z-axis direction from the periphery of the bottom plate 61a, and is formed as a box shape that is open upward in the Z-axis direction. The panel 62 extends rectangularly along the XY plane and closes the housing 61 from above in the Z-axis direction.

The housing 61 houses the constituents (not illustrated) needed to achieve the various functions of the electronic device 60, such as circuit boards and electronic components. The panel 62 is constituted as a touch panel. In other words, the panel 62 provides both an image display function to display images and an input function to detect input operations performed by the user using a finger, etc.

It should be noted that the panel 62 is not limited to a touch panel and need not have the aforementioned constitution. For example, the panel 62 may be a touch pad that only has an input function and no image display function. Also, the panel 62 may be a protective panel that protects a touch panel provided separately as part of the electronic device 60.

The multilayer piezoelectric element 10 is adhered to the bottom face of the panel 62 in the Z-axis direction and faces the bottom plate 61a inside the housing 61. The position of the multilayer piezoelectric element 10 on the bottom face of the panel 62 in the Z-axis direction can be determined as desired. With the electronic device 60, the panel 62 serves the function of the vibration plate 51 in the piezoelectric vibration apparatus 50 shown in FIG. 14.

In other words, the electronic device 60 can vibrate the panel 62 as a result of the multilayer piezoelectric element 10 extending/contracting in the X-axis direction. Accordingly, the main ingredient of the panel 62 is preferably glass, acrylic resin, etc., that can vibrate in a favorable manner. Also, the adhesive layer that adheres the multilayer piezoelectric element 10 and the panel 62 is constituted preferably in a manner similar to the adhesive layer 52 of the piezoelectric vibration apparatus 50.

The electronic device 60 can provide audio information to the user by vibrating the panel 62 and thereby generating sound through air conduction, bone conduction, etc. In addition, the electronic device 60 can also provide haptic sensations to the user who performs input operations on the panel 62, by vibrating the panel 62, for example.

It should be noted that, while the top face of the panel 62 in the Z-axis direction is typically a flat surface, it may be a curved surface, etc., for example. Also, the electronic device 60 is not limited to a smartphone and may be constituted as a tablet terminal, notebook PC, mobile phone, watch, photo stand, or a remote control or operating part, etc., of various types of devices.

The foregoing explained an embodiment of the present invention; however, it goes without saying that the present invention is not limited to the aforementioned embodiment and various modifications can be added.

For example, although the multilayer piezoelectric element 10 was explained as having the surface electrodes 16, 17, it may not have surface electrodes. In this case, cover parts are formed, by an insulating ceramic, near the principal faces 11e, 11f of the multilayer piezoelectric body 11. This way, the multilayer piezoelectric body can still be protected by the cover parts in the Z-axis direction.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-122193, filed Jun. 22, 2017, and No. 2018-045559, filed Mar. 13, 2018, each disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A multilayer piezoelectric element, comprising:
a multilayer piezoelectric body having: a pair of principal faces that are facing each other in a first-axis direction which is a thickness direction; a pair of end faces that are facing each other in a second-axis direction which is a longitudinal direction perpendicular to the first-axis direction; and a pair of side faces that are facing each other in a third-axis direction which is a width direction perpendicular to the first-axis direction and second-axis direction; and
multiple internal electrodes placed inside the multilayer piezoelectric body and stacked in the first-axis direction;
wherein, among the multiple internal electrodes, a center internal electrode placed at a center part of the multilayer piezoelectric body is such that a first cross-sectional shape, as viewed from the third-axis direction, has undulations, a magnitude of which is greater than a magnitude of undulations, if any, of a second cross-sectional shape of the center internal electrode as viewed from the second-axis direction, so that the center internal electrode is not completely flat but is wavy wherein a wave amplitude in the first cross-sectional shape is greater than a wave amplitude, if any, in the second cross-sectional shape in a non-operating state.

2. The multilayer piezoelectric element according to claim 1, wherein:
a maximum dimension of divergence in the first-axis direction between a first running line that runs along a center of the first cross-sectional shape of the center internal electrode in the first-axis direction and has a length of 100 μm in the second-axis direction, and a first reference line that connects end points of the first running line, is greater than a maximum dimension of divergence in the first-axis direction between a second running line that runs along a center of the center internal electrode in the second cross-sectional shape in the first-axis direction and has a length of 100 μm in the third-axis direction, and a second reference line that connects end points of the second running line.

3. The multilayer piezoelectric element according to claim 2, wherein:
the maximum dimension of divergence between the first running line and the first reference line is 2 μm or greater.

4. The multilayer piezoelectric element according to claim 1, wherein:
the magnitude of undulations of the first cross-sectional shape of the center internal electrode is greater, as viewed from the third-axis direction, than a magnitude of undulations, if any, of a third cross-sectional shape of, among the multiple internal electrodes, a marginal internal electrode placed at a position closest to one principal face of the pair of principal faces of the multilayer piezoelectric body.

5. An piezoelectric vibration apparatus comprising:
the multilayer piezoelectric element according to claim 1;
a vibration plate facing the multilayer piezoelectric element in the first-axis direction; and
an adhesive layer placed between the multilayer piezoelectric element and the vibration plate.

6. An piezoelectric vibration apparatus comprising:
the multilayer piezoelectric element according to claim 2;
a vibration plate facing the multilayer piezoelectric element in the first-axis direction; and
an adhesive layer placed between the multilayer piezoelectric element and the vibration plate.

7. An piezoelectric vibration apparatus comprising:
the multilayer piezoelectric element according to claim 3;
a vibration plate facing the multilayer piezoelectric element in the first-axis direction; and
an adhesive layer placed between the multilayer piezoelectric element and the vibration plate.

8. An piezoelectric vibration apparatus comprising:
the multilayer piezoelectric element according to claim 4;
a vibration plate facing the multilayer piezoelectric element in the first-axis direction; and
an adhesive layer placed between the multilayer piezoelectric element and the vibration plate.

9. An electronic device comprising:
a multilayer piezoelectric element according to claim 1;
a panel to which the multilayer piezoelectric element is adhered in such a way that the two are facing each other in the first-axis direction; and
a housing retaining the panel.

10. An electronic device comprising:
a multilayer piezoelectric element according to claim 2;
a panel to which the multilayer piezoelectric element is adhered in such a way that the two are facing each other in the first-axis direction; and
a housing retaining the panel.

11. An electronic device comprising:
a multilayer piezoelectric element according to claim 3;
a panel to which the multilayer piezoelectric element is adhered in such a way that the two are facing each other in the first-axis direction; and
a housing retaining the panel.

12. An electronic device comprising:
a multilayer piezoelectric element according to claim 4;
a panel to which the multilayer piezoelectric element is adhered in such a way that the two are facing each other in the first-axis direction; and
a housing retaining the panel.

* * * * *